United States Patent [19]

Mansfield et al.

[11] Patent Number: 5,168,228
[45] Date of Patent: Dec. 1, 1992

[54] ECHO PLANAR IMAGING SYSTEMS

[75] Inventors: Peter Mansfield; Roger J. Ordidge; Ronald J. Coxon, all of Nottingham, England

[73] Assignee: National Researh Development Corporation, London, England

[21] Appl. No.: 700,883

[22] Filed: May 10, 1991

Related U.S. Application Data

[63] Continuation of Ser. No. 194,625, May 16, 1988, abandoned.

[30] Foreign Application Priority Data

May 14, 1987 [GB] United Kingdom ............... 8711379

[51] Int. Cl.$^5$ ............................................. G01R 33/20
[52] U.S. Cl. ........................................................ 324/309
[58] Field of Search ....................... 324/307, 309, 312

[56] References Cited

U.S. PATENT DOCUMENTS

| | | | |
|---|---|---|---|
| 4,115,730 | 9/1978 | Mansfield | 324/309 |
| 4,528,985 | 7/1985 | Macovski | 324/309 |
| 4,588,948 | 5/1986 | Mansfield | 324/309 |
| 4,644,278 | 2/1987 | Sano et al. | 324/309 |
| 4,644,280 | 2/1987 | Paltiel | 324/309 |
| 4,733,188 | 3/1988 | Sekihara | 324/312 |

FOREIGN PATENT DOCUMENTS 0144026 6/1985 European Pat. Off. .
60-185149 9/1985 Japan .

OTHER PUBLICATIONS

C. B. Ahn et al., High-Speed Spiral-Scan Echo Planar NMR Imaging-I, IEEE Transactions on Medical Imaging, vol. MI5, No. 1, Mar. 1986.

Stig Ljunggren, A Simple Graphical Representaton of Fourier-Based Imaging Methods, Journal of Magnetic Resonance 54, 338-343 (1983).

D. N. Guilfoyle and P. Mansfield, Chemical Shift Imaging, Magnetic Resonnance in Medicine 2, 479-489, 1985.

*Primary Examiner*—Michael J. Tokar
*Attorney, Agent, or Firm*—Cushman, Darby & Cushman

[57] ABSTRACT

Zonal magnification of a selected area of an image produced by Echo Planar Imaging is acheived by taking images of a defined area in the presence of a selective 180° R.F. control pulse so that subsequent processing produces a magnified image of the selected area with enhanced resolution.

18 Claims, 7 Drawing Sheets

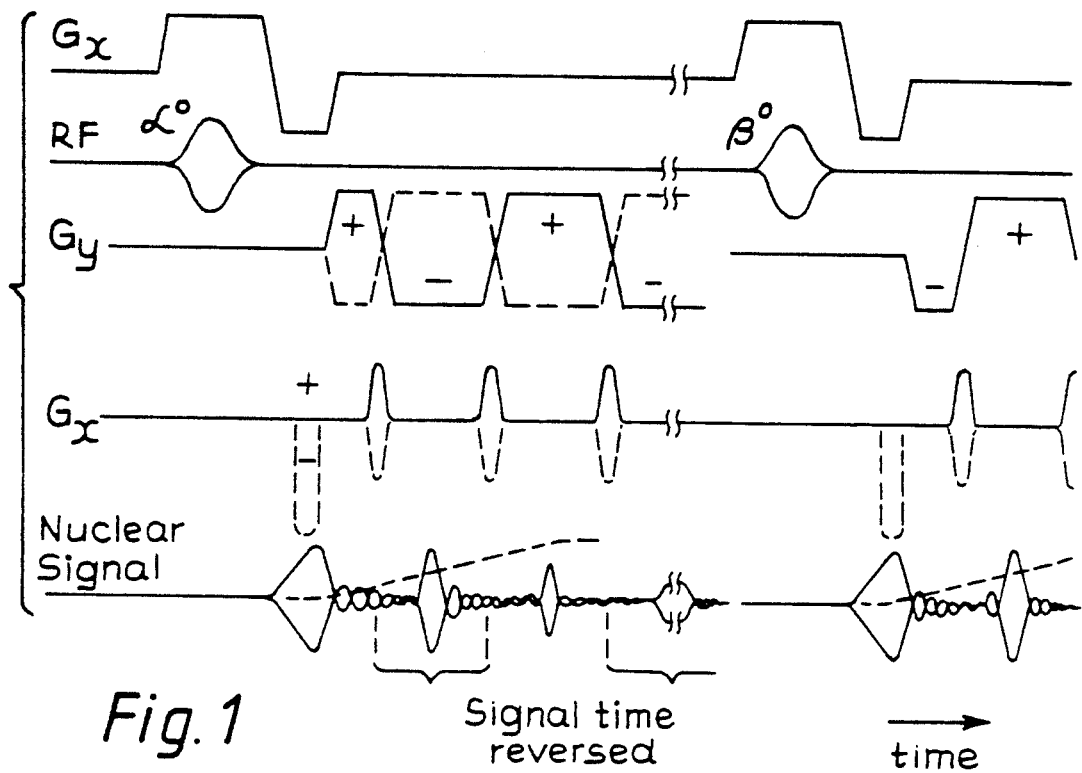
Fig. 1
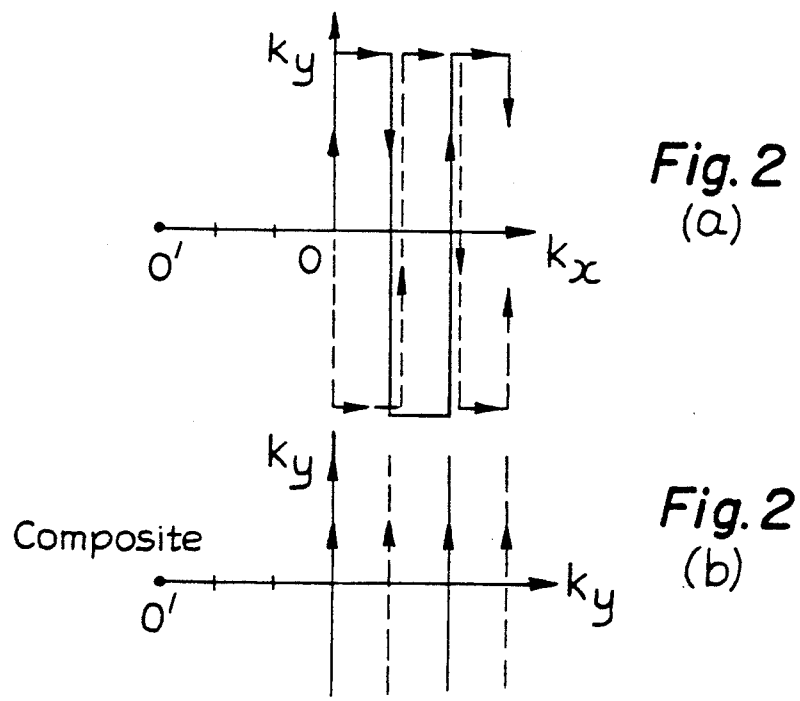
Fig. 2 (a)
Fig. 2 (b)

64 pts
Wrap around
Fixed bandwidth
128 pts
No overlap

FIG. 8-2
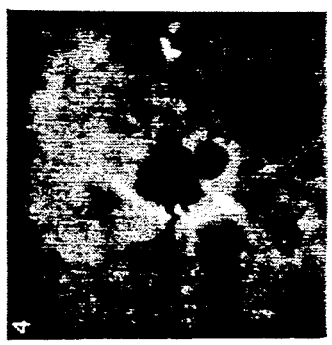
FIG. 8-4
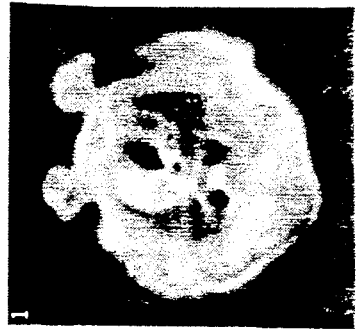
FIG. 8-1
FIG. 8-3
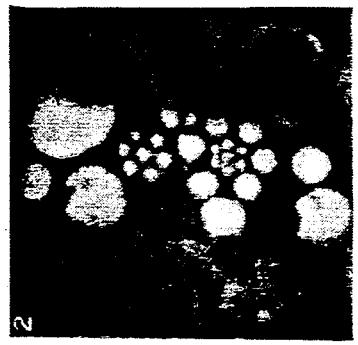
FIG. 7-2
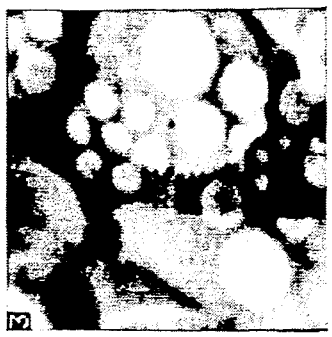
FIG. 7-4
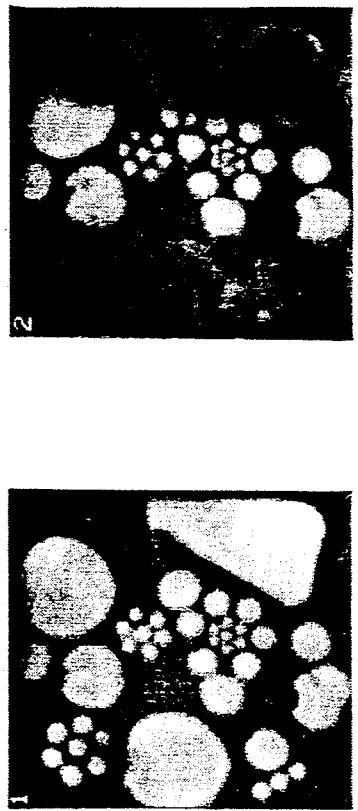
FIG. 7-1
FIG. 7-3

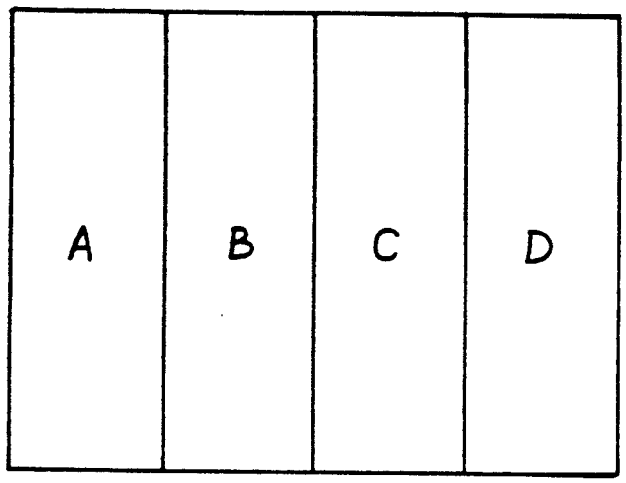
Fig. 10
(a)
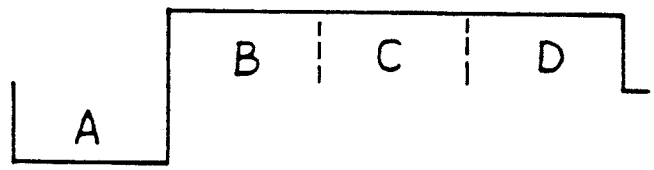
Fig. b1.
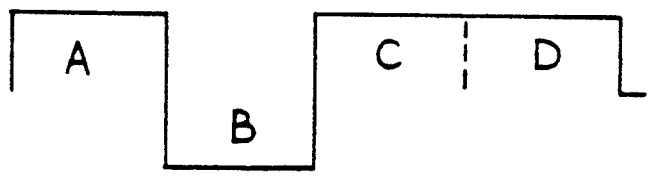
Fig. b2.
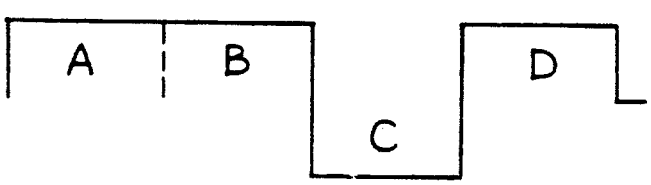
Fig. b3.
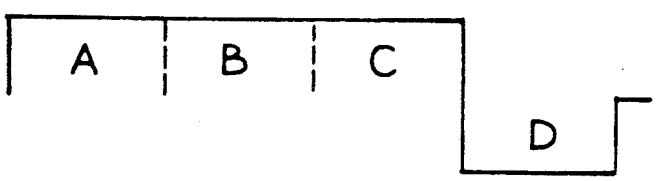
Fig. b4.

ECHO PLANAR IMAGING SYSTEMS

This is a continuation of application Ser. No. 07/194,625, filed on May 16, 1988, which was abandoned.

The present invention relates to Echo Planar Imaging (EPI) systems and more particularly to a method and apparatus for providing zonal magnification of a desired area of an image.

Echo Planar Imaging (EPI) is well known for its ultra high speed and ability to produce real time movies (Mansfield P. 1977 J. Physics C, 10.L55). The resolution obtainable with current EPI systems however is poor when compared with for example current commercial magnetic resonance imaging (MRI) equipment based on much slower imaging methods.

It is an object of the present invention to provide a true rapid zonal magnification of an image formed by EPI techniques (i.e. a zoomed image) with genuine gains in resolution.

The present invention provides a method of zonal magnification of an echo planar image (EPI) by the addition of a selective 180° R.F. control pulse and predetermined gradients which predetermined gradients and R.F. control pulse in combination with gradients and selective pulses commonly used in EPI techniques define the zone to be magnified and the subsequent magnification factor of that zone.

The term EPI is taken to include images of which at least one dimension is spatial and in which the second may be a spatial or a chemical shift dimension.

The present invention also provides a method of enhancing the image produced in an EPI system in which at least a first and a second image are taken of a defined area, in which at least one defined portion of the second image is produced by use of a control signal to generate the defined portion in which the first and second images are subtracted from each other to produce a cancellation of any of the areas outside the defined area and in which the defined area is then expanded to produce a magnified image of the defined area.

In a first embodiment the defined area forms a central strip within a generally rectangular image field, the central strip being expanded to fill the complete image field.

In a second embodiment the defined area comprises a strip which is one quarter the width of the complete image field. Preferably four images are taken of the picture area each varying from the others by the selection of the defined quarter thereby rendering magnification of any quarter of the image field.

Preferably all images are permanently stored electronically for subsequent recovery of the enhanced image and for reference to the complete picture prior to enhancement.

The present invention provides apparatus for zonal magnification of an echo planar image including means for adding a selective 180° R.F. control pulse and appropriate gradients to define a zone to be magnified.

The invention also provides apparatus for enhancing an image including Echo Planar Imaging apparatus, means for taking at least a first and second image of a defined area said means comprising means for defining a required portion of the image during the second imaging process using an additional 180° R.F. control pulse means for storing the first and second images, means for combining the two images, and means for expanding the information left after the combination process to produce an enlarged picture of the defined area.

Embodiments of the present invention will now be described, by way of example with reference to the accompanying drawings in which:

FIG. 1 shows pulse and timing diagrams for a single or double Blipped Echo Planar Imaging BEPI embodiment according to the invention;

FIG. 2 (a) shows a map of k-space illustrating the embodiment of FIG. 1 and FIG. 2(b) shows an alternative map of k-space;

FIGS. 7 to 9 show various experimental results; and

FIG. 10 illustrates the principles of a four fold zoom experiment.

In normal unzoomed single slice imaging by BEPI, following slice selection by selective exitation (Garroway, Grannell and Mansfield, 1974 J. Phys. C 7, L457), the nuclear signal is allowed to evolve in an ideally square-wave modulated y-gradient $G_y$ and an x-gradient in the form of a series of delta function pulses. (In practice an approximately trapezoidal waveform is used for $G_y$ while $G_x$ is applied in the form of short but finite duration blips). The selective pulse and gradient timings are sketched in FIG. 1. As sketched, the starting phase of $G_y$ may be $+ve$ or $-ve$. The $G_x$ blips may be all $+ve$ or all $-ve$. There are, therefore, four different possibilities for the nuclear signal, S(t), i.e. $S++$, $S+-$, $S-+$ and $S--$, each one of which is able to produce a single shot image.

The free induction decay signal S(t) in the rotating reference frame at time t following slice selection, is given generally by $$S(t) = S(k) = r.p. \int \rho(r) \exp[k.r] dr \qquad (1)$$

where $\rho(r)$ is the spin density within the slice at position r, and k is the reciprocal space wave vector (Mansfield and Grannell, 1973 J. Phys. C6, L422; 1975 Phys. Review 12, 3618; Ljunggren, 1983 J. Mag. Res. 54, 338) given by $$k = \int_o^t \gamma[iG_x(t') + jG_y(t')]dt' \qquad (2)$$

in which $\gamma$ is the magneto-gyric ratio and $G_x(t')$ and $G_y(t')$ are linear time-dependent magnetic field gradients.

Figures 1, 9:
Figures 2, 9:
Figures 3, 9:
Figures 4, 9:

FIG. 2 shows various pathways scanning k-space which correspond to the different gradient combinations mentioned above. In performing the Fourier transform (FT) of the k-space map it is necessary that the arrows in the k-trajectories all point in the same direction. This may be achieved in two ways; the first by performing two experiments in rapid succession, the second of which has the starting phase of $G_y$ reversed. The $G_x$ blips have the same sense for both experiments. To equalize the signal amplitudes from both experiments, the first and second selective pulses must have nutation angles of 45° and 90° respectively. The two signal echo trains may then be edited and spliced to produce two signals, in which spin evolution occurs effectively in either a wholly positive or wholly negative gradient. The $k_y$-trajectories for these spliced signals are either all negative to positive or vice versa. The two images produced upon Fourier transformation are inverted mirror images of each other. However, reversing and co-adding in image space results in a $\sqrt{2}$ improvement in signal-noise ratio. The above described procedure is a two shot imaging process and is similar to standard EPI.

The second procedure is a true one shot imaging process. Here, the signal echoes are recorded in a suitable electronic memory (not shown) after one selective pulse which may have a 90° nutation angle or some other arbitrary low angle, $\alpha°$. To get the k-trajectories all pointing in the same direction, time domain signals from alternate echoes are reversed. This edited decay signal is then Fourier transformed using a single one dimensional FT. This imaging process is hereinafter referred to as BEPI or BEST (Blipped Echo-planar Single-pulse Technique).

For square-wave gradient modulation, and when there is insignificant signal decay over the duration of an individual echo, it can be shown that for discrete signal sampling, the edited BEPI time signal is equivalent to the discrete function $$S^{\pm+}(t) = \Sigma\Sigma\Delta_x\Delta_y\rho_{lm}\cos[\cos l\Delta w_x TM\Delta W_y]t \quad (3)$$

where l and m are integers and $\rho_{lm}$ is the density of the l,mth pixel with area $\Delta_x\Delta_y$.

The discrete Fourier transform of equation (3) over a sampling period T yields a stick spectrum with a discrete point spacing of $$\Delta\omega_p = \Delta w_x = 2\pi/T = 65\ \Delta_x G_x \quad (4)$$

and a stick spacing of $$\Delta\omega_y = \gamma\Delta y G_y. \quad (5)$$

For non-overlap of spectral components we must satisfy the condition $$\Delta\omega_y = L\Delta\omega_x \quad (6)$$

where L here and M below are the largest values of l and m which span the object field.

The total number of points describing the image $$P = LM \quad (7)$$

From above, the total bandwidth required to handle a full image array is $$\Delta\omega_p P = LM\Delta\omega_x = M\Delta\omega_y \quad (8)$$

Referring to FIG. 1 and to equations (4) and (5) we may also write $$T = \tau P = M\tau_y \quad (9)$$

for a complex FT where $\tau$ is the sampling period and the y-gradient echoes are modulo $2\tau_y$.

The zoom effect according to the present invention which we refer to as Zoomed EPI (ZEPI), is achieved as follows.

Let the object field be rectangular with a side length $\gamma a$. From equation (8), together with the total frequency range representing the object field we may write the required gradient strength for normal BEPI as $$G_y = M\Delta\omega_y/\gamma_a = LM\Delta\omega_x\gamma_a = 2\pi LM/\gamma_a T. \quad (10)$$

For a rectangular image field $L = M$ so that equation (10) predicts a squared dependence of $G_y$ on image array size M for constant T.

Figure 3:
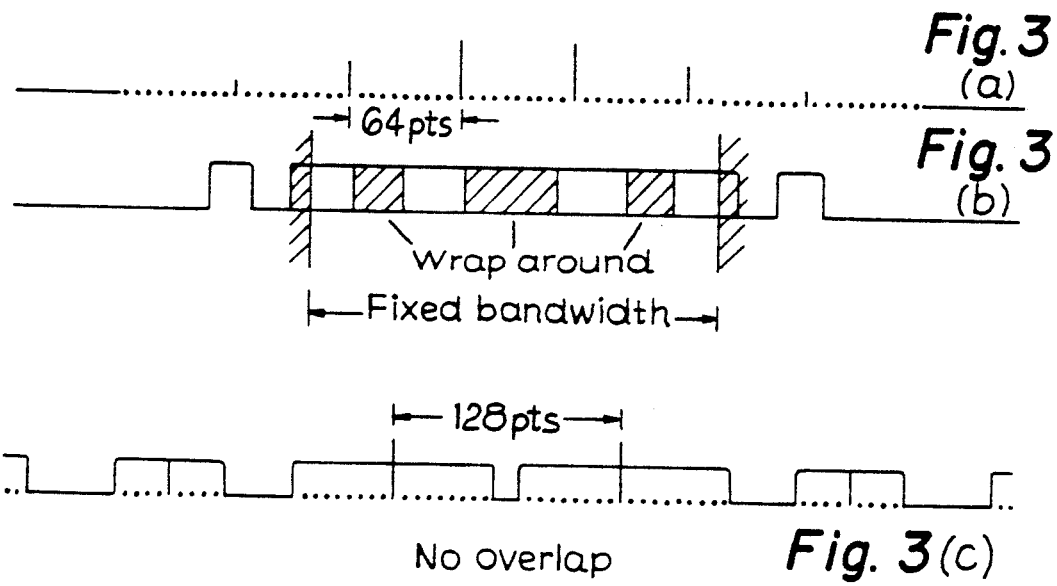
FIG. 3 shows sketches of broadened stick spectra.

In ZEPI the object is to achieve with a small fixed array size the spatial resolution improvements normally associated with a large image array. In this case the stick spacing $\Delta\omega_y$ is kept constant in equation (10) thus making $G_y$ directly proportional to M. The same is true for equation (8) and means that for zoomed images the total bandwidth required to fully describe the image is proportional to M rather than $M^2$. The fact that the y-stick spacing, and hence the gradient modulation period, does not change means that an increase of the broadening x-gradient causes overlap or allaying of the image. These points are best illustrated with examples of the stick and broadened spectra expected for particular arrays. FIG. 3a shows the image spectrum for a 64 × 64 array. It is assumed that the object field as defined above is filled and that the data acquisition is bandwidth limited according to equation (8). FIG. 3b represents the zoomed image spectrum when magnified by a factor of two. Some image information lies outside the receiver bandwidth and for fixed bandwidth is lost. However, by just doubling both the bandwidth and sampling rate so that 64 × 128 data points are captured, a 128 × 64 pixel image may be constructed. This image contains wrap-around artifact due to overlap of the broadened profiles. FIG. 3c shows the image spectrum for a 128 × 128 image. The overlap apparent in FIG. 3b is removed by virtue of the wider stick spacing concomitant with a change in the y-gradient switching period.

Two experimental zoom sequences are now described which effectively remove the image wrap-around effect referred to above which occurs when the x-gradient is increased. Both sequences use 90° or lower angle selective pulses for initial slice selection plus a selective 180° pulse.

Figure 4:
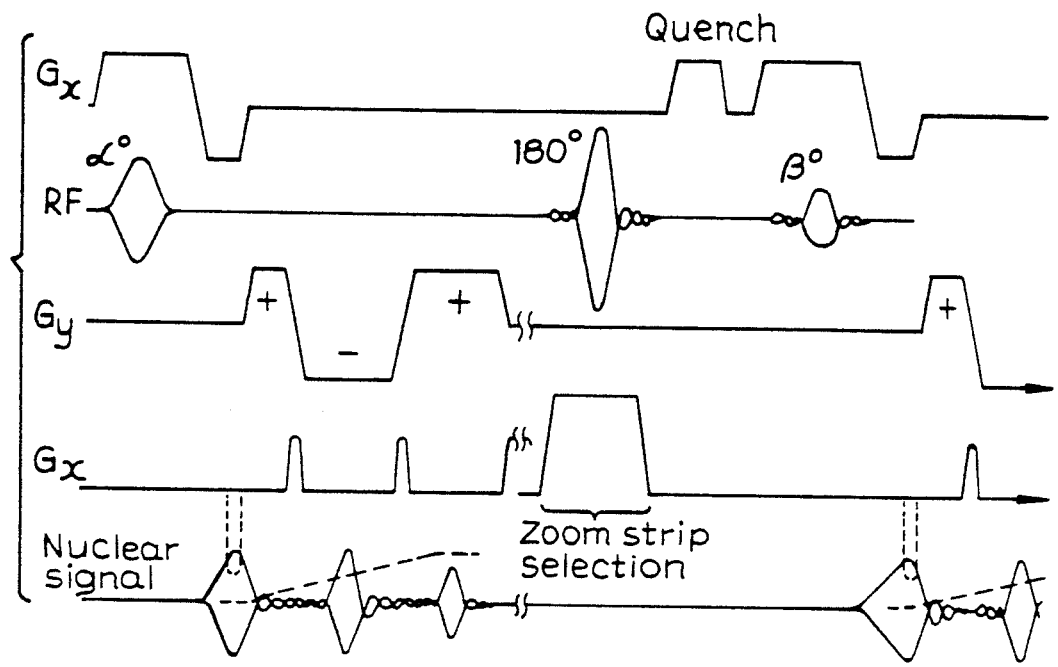
FIG. 4 shows pulse and gradient timing diagrams for a first embodiment of the present invention.

The first sequence ZEPI-2 is a modified double BEPI experiment and is illustrated in FIG. 4. The difference between this and FIG. 1 is the selective 180° pulse sandwiched between the two BEPI experiments. This together with the x-gradient pulse constitute the zoom strip selection process. Ordinarily there would be no signal following a 180° pulse. However as a precaution against interference from residual signals a short burst gradient quench or scrambler pulse is preferably used which may be along y or z or a combination of all three axes. The zoom strip selection process is then rapidly followed by the second BEPI experiment. The slice selection pulses, $\alpha$ and $\beta$, may be 45° and 90° respectively for slow repetition experiments, or they may be low angle nutation pulses. In either case the angles must satisfy the expression (Mansfield, 1984, Mag. Res. Med. 1, 370).

$$\tan\alpha = \sin\beta \quad (11)$$

For low angles, $\alpha = \beta$

If either ZEPI-1 or ZEPI-2 are to be applied in a fast repetition mode it is preferable to include a slice selective 180° RF pulse at the end of the sequence. This avoids alternation of the longitudinal spin magnetization in successive zoom experiments with an associated degradation in image quality from non-uniform spin-lattice relaxation.

A selective 180° RF pulse should immediately follow the ZEPI-1 sequence, and a selective 180° RF pulse should immediately follow the two shot experiment of ZEPI-2.

Figure 5A:
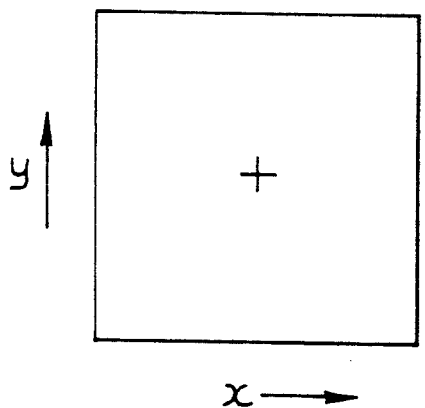
FIG. 5 shows image field representations illustrating the present invention.
Figure 5B:
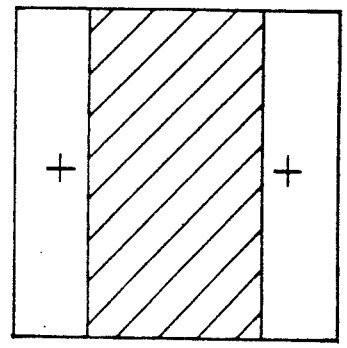

The zooming procedure may be better understood by reference to FIG. 5. Let FIG. 5a represent the BEP image from the first half of the zoom experiment. The + represents the signal phase of the image. FIG. 5b is the BEP image from the second half of the experiment. The selective 180° pulse reverses the signal phase in a well defined strip of the image as indicated. Subtraction of the two images leaves the central strip which may then be expanded along the x-axis to fill the whole of the image field. This is done by simply increasing the x-gradient. If viewed separately the images from each half of the zoom experiment exhibit wrap-around in the x-axis. But co-subtraction of the images completely removes this artifact. Expansion of the image along the y-axis is simply achieved by increasing the y-gradient with fixed receiver bandwidth. Image data at the top and bottom of the image are pushed outside the filter band width and therefore disappear from view. Of course, these lost data may be retained by increasing both the receiver bandwidth and the total number of sample points without further increasing either the x- or the y-gradient. In this case a full expanded image matrix would be available at no extra overhead in either time or gradient strength. However, such an approach involves handling larger data arrays and especially larger Fourier transforms. But as outlined hereinbefore, for a zoom factor of two the array size is doubled. This is contrasted with a standard BEPI or EPI approach where an increase in image resolution of a factor of two means a quadrupling in data array size and y-gradient strength.

Figure 6:
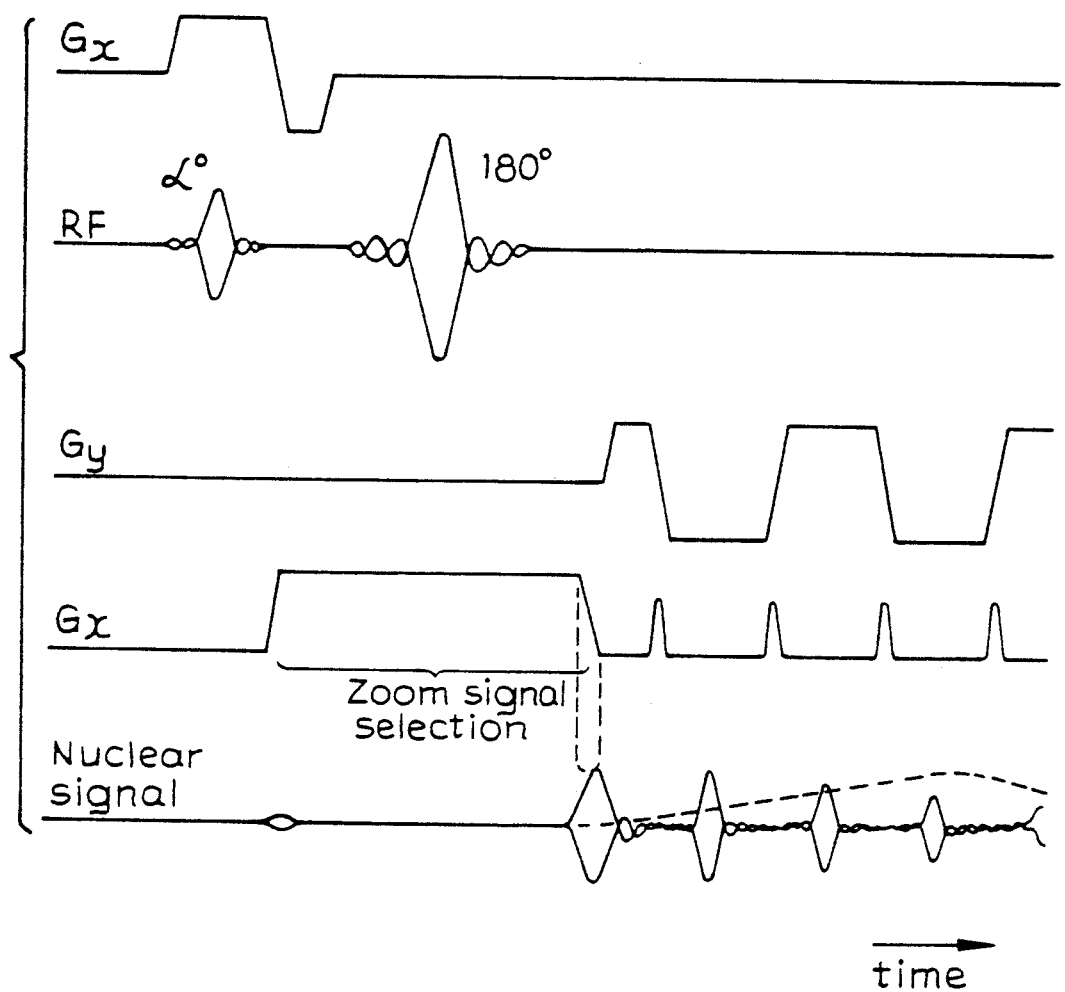
FIG. 6 shows pulse and gradient diagrams for a second embodiment according to the present invention.

The second zonal image magnification sequence (ZEPI-1) uses only one BEPI sequence and is a true zoom method in so far as expanded data along the x-axis which flows off the edge of an image are irretrievably lost. This is not the case for y-gradient expansion. The same conditions of bandwidth and sampling apply. The pulse sequence timing diagram is sketched in FIG. 6. Following initial slice selection with an α pulse, the selected signal is allowed to decay to zero amplitude in an x-gradient. While this is still switched on a selective 180° pulse is applied which defines the zoomed strip within the image. Only those spins within the zoom strip will refocus in a spin echo. At the spin echo peak the signal is examined by BEPI in a one shot process. By increasing the x-gradient amplitude, the signal from the refocussed strip may be expanded to completely fill the image field along the x-axis. Since there is no signal contribution from regions of the object outside the strip, there are no wrap-around effects. Expansion along the y-axis requires an increase of y-gradient with fixed receiver bandwidth as for the first zoom method. In the slow repetition rate version of this experiment, the slice selection pulse nutation angle is 90°.

Both ZEPI-1 and ZEPI-2 sequences have been tried in practice. FIG. 7 shows several images of a phantom each corresponding to various stages in a ZEPI-1 experiment. FIG. 7.1 is the unzoomed BEPI image, the object field of which comprises a collection of bottles and tubes of various shapes and sizes which is referred to as the fruit phantom. FIG. 7.2 is the selected strip for zooming from within the fruit phantom. FIG. 7.3 is the magnified image without zoom strip selection and clearly demonstrates the wrap-around artifact in the x-axis. FIG. 7.4 is the full zoom experiment with no wrap-around artifact. In this case image magnification is x2 along both axes. Note the much improved resolution of the cluster of small tubes in the upper right hand field of FIG. 7.1. Each tube has a diameter of 5 mm with a spacing of around 1.5 mm. The basic spatial resolution in this image is 3 mm making the tubes just resolved in this cluster. This same cluster of tubes is clearly resolved in the fully zoomed image of FIG. 7.4.

FIG. 8 shows ZEPI-2 transactions taken through the mediastinum of a live piglet. FIGS. 8.1 and 8.3 are unzoomed BEPI transactions at different levels in the heart. FIGS. 8.2 and 8.4 are the corresponding zoomed images and demonstrate improved resolution of the major cardiac vessels and structures. The zoomed images are averages of 128 separate shots and took two minutes to accumulate at an operating Larmor frequency of 4 MHz.

FIG. 9 shows images of the same transectional views as FIG. 8 but were obtained by the alternative ZEPI-1 sequence.

The present invention is advantageous because standard EPI and standard BEPI imaging become more difficult to implement as array size, and hence resolution increases. This is because, for an $m \times m$ image array, the required gradient strength varies as $m^2$. In the zoomed imaging variants; according to the present invention, however, the required gradient strength only varies only as m.

The basic philosophy for zooming in accordance with the present invention is to work with a fixed image array size. Improvements in spatial resolution are then achieved by zonally magnifying smaller and smaller regions of the object field. Two zoom versions have been described hereinbefore, ZEPI-1 and ZEPI-2. In ZEPI-2 the full expanded data set is recoverable by minor modification of the zoom procedure. This means, for example, that a zoomed experiment with a $64 \times 64$ pixel array may be easily modified to give a $128 \times 128$ pixel array with no further demands on the gradient driver. Although zooming by more than a factor of two is possible, because of double or triple x-axis wrap-around, the full matrix data set is not recoverable. In ZEPI-1 only half the full expanded data set is recoverable along the y-axis. Expanded data along the x-axis which falls outside the zoom strip is irretrievably lose.

Both zoom versions have been tried in practice and appear to work well. For very rapidly moving targets ZEPI-1 offers the advantage of almost a factor of two reduction in imaging time. This can be important in preventing motional blurring of the image, a factor which becomes increasingly manifest with improved resolution. ZEPI-2 is slower and is more useful in cases when motion of the object is less rapid. It has the advantage, when zooming by a factor of two, that the full image field at the higher resolution is recoverable.

Further modifications of the zoom principle are possible which allow images comprising $256 \times 256$ pixels, to be produced in four separate experiments and with a basic array size of $64 \times 256$. With suitably high x-gradients a fourfold wraparound would occur. But this can be unravelled, just as in the case described above for twofold wraparound. In accordance with a further embodiment of the present invention this is achieved by selectively inverting each of four contiguous strips in the image in each of the four experiments. Let the strips be labelled A, B, C and D (see FIG. 10a). The x-gradient is increased until the selected strip width equals 64 points with fourfold wraparound. In this case the image will comprise signals from all four strips for each of the four experiments as follows:

1. $-A+B+C+C$
2. $A-B+C+D$
3. $A+B-C+D$
4. $A+B+C-D$

By co-adding the signals in the following patterns:

$-1+2+3+4=4A$ $1-2+3+4=4B$ $1+2-3+4=4C$ $1+2+3-4=4D$ each region of the image is completely recoverable so that the whole image may be constituted into a single 256×256 array. Creases in the image along the zoom selection edges may be minimized by using optimized selective inversion sequences.

If the whole imaging process takes m shots to perform, a signal-noise ratio improvement of $m^{\frac{1}{2}}$ is expected. In this example a factor of 2 improvement is obtained.

The y gradient waveforms are ideally rectangular. In this case the signal is linearly sampled so that equal increments k of the reciprocal space wave vector occur between sample points. In practice the switched gradients have a finite slew rate making the waveform trapezoidal (see FIG. 4). In such a case, signal sampling may be arranged to be non-linear in the ramped regions so that overall, equal increments ky occur between sample points as in the ideal case. Any periodic y-gradient waveform may be used instead of that illustrated (e.g. cosinusoidal or triangular) provided the nuclear signal evolving under this gradient is non-linearly sampled with a suitable signal sampling pattern which generates equal increments of $\Delta k_y$. (See Mansfield and Ordidge—U.K. Patent No. 8128524).

The sampling times must be chosen such that $$n\Delta k_y = \int_{t_{n-1}}^{t_n} \gamma q_y(t')dt.$$

for n=1, 2, 3 ... where $t_n$ are the signal sampling times starting with $t_o=0$.

A modification of both ZEPI-1 and ZEPI-2 is further described which allows modulus images rather than amplitude images to be oduced.

The object is to introduce additional negative x-gradient pulses (marked in FIGS. 1, 4 and 6 dotted) which effectively moves the starting point of the k-space scan, FIG. 2, from 0 to 0'. This means that in both zoom experiments, the full k-plane is scanned. A power F.T. rather than an amplitude F.T. may therefore be performed on the signal echo trains (which now start with two signal amplitudes and grow to a peak before decaying away; see dotted echo envelope curves in FIGS. 1, 4 and 6). The effect of this change is that the images produced are independent of signal phase. This makes the experiment less dependent on local field inhomogeneities and therefore experimentally more robust. We refer to these modulus versions of zoom imaging as Z-MEPI-1 and Z-MEPI-2 respectively.

It should be noted that since the images are phase independent, the additions and subtractions of data required for Z-MEPI-2 and for four fold and higher magnification, and must be performed with the time data. Z-MEPI-1 requires no signal additions and subtractions.

A further application of the technique is for chemical shift imaging. Both ZEPI techniques (e.g. ZEPI-1 and ZEPI-2 FIGS. 1, 4 and 6) can be simplified by removal of the $G_x$ gradient blips. The spatial information along the x axis of the image is therefore replaced by chemical shift information. The result is the NMR chemical shift spectrum from a series of volume elements constituting a column. The cross-sectional dimensions of the column are determined by the zoom slice selection procedure. Spatial information along the column is obtained by application of the modulated $G_y$ gradient, with chemical shift information in the orthogonal direction. The result is therefore a two dimensional map with chemical shift information along one axis and y spatial information along the second dimension obtained from a steerable volume defined by the zoom procedure. All of this is controlled by electronic control means.

What is claimed is:

1. A method of magnifying an image produced in an EPI system in which at least a first and second image are taken of a defined area, in which at least one defined portion of the second image is produced by use of a selective 180° control pulse in the presence of a gradient pulse to generate the defined portion in which the first and second images are subtracted from each other to produce a cancellation of any of the areas outside the defined area and in which the defined area is then expanded to produce a magnified image of the defined area.

2. A method of enhancing the image produced in an EPI system as claimed in claim 1 in which all images are permanently stored electronically for subsequent recovery of the enhanced image and for reference to the complete picture prior to enhancement.

3. A method of zonal magnification as claimed in claim 1 in which NMR chemical shift spectra are produced from a series of consecutive elements forming a column which has been selected.

4. A method of zonal magnification as claimed in claim 1 in which the image is constructed from the signal data by using a power or magnitude Fourier transform.

5. A method of zonal magnification as claimed in claim 1, in which the image is constructed from the signal data by using an amplitude Fourier transform.

6. A method of enhancing the image produced in an EPI system as claimed in claim 5 in which the defined zone comprises a strip which is one quarter the width of the complete image field.

7. A method of enhancing the image produced in an EPI system as claimed in claim 6 comprising the additional steps of taking four images of a picture area each varying from the others by the selection of the defined quarter, and co-adding image signals from these quarters and subtracting an image signal from the fourth selected quarter, thereby rendering magnification of any quarter of the image field.

8. Apparatus for enhancing an image including Echo Planar Imaging (EPI) apparatus, means for taking at least a first and second image of a defined area said means comprising means for defining a required portion of the image during the second imaging process using a selective 180° R.F. control pulse, means for storing the first and second images, means for combining the two images, and means for expanding the information left after the combination process to produce an enlarged picture of the defined area.

9. Apparatus for enhancing an image as claimed in claim 8 in which the means for taking at least the first and second image of a defined area comprises electronic control apparatus.

10. Apparatus for enhancing an image as claimed in claim 9 in which the electronic control apparatus is operative to select the defined area as a central strip within a generally rectangular image field.

11. Apparatus for enhancing an image as claimed in claim 9 in which the electronic control apparatus is operative to select the defined area as one quarter of a complete image field.

12. A method of zonal magnification of a defined region of an echo-planar image (EPI) comprising a spin interrogation phase int e time period between an initial selected slice selection procedure and the EPI experiment in which a selective 180° R.F. control pulse is applied in the presence of a gradient pulse, the selective 180° R.F. control pulse being operative to invert the magnetization of a strip within the selected slice, the strip comprising the defined zone to be magnified.

13. A method of zonal magnification as claimed in claim 12 in which the 180° RF control pulse is used to form a spin echo from regions of the object which define the zone to be magnified.

14. A method of zonal magnification as claimed in claim 14 in which NMR chemical shift spectra are produced from a series of consecutive elements forming a column which has been selected.

15. A method of zonal magnification as claimed in claim 12 in which the image is constructed from the signal data by using a power or magnitude Fourier transform.

16. A method of zonal magnification as claimed in claim 12 in which the image is constructed from the signal data by using an amplitude Fourier transform.

17. A method of magnifying the image produced in the EPI system as claimed in claim 12 in which the defined zone forms a central strip within a generally rectangular image field, the central strip being expanded to fill the complete image field.

18. Apparatus for zonal magnification of a defined region of an echo planar image (EPI) comprising means for generating an initial slice selection procedure to define a slice, means for generating a selective 180° R.F. control pulse in the presence of a gradient pulse, which selective 180° R.F. control pulse is operative to invert a magnetization of a strip within the slice, the strip comprising the defined zone to be magnified, and means for performing an EPI experiment in a spin interrogation phase following the generation of the selective 180° R.F. control pulse.

* * * * *